US011145495B2

(12) United States Patent
Balon et al.

(10) Patent No.: US 11,145,495 B2
(45) Date of Patent: Oct. 12, 2021

(54) VACUUM TREATMENT CHAMBER AND METHOD OF MANUFACTURING A VACUUM TREATED PLATE-SHAPED SUBSTRATE

(71) Applicant: Evatec AG, Trubbach (CH)

(72) Inventors: Frantisek Balon, Buchs (CH); Jurgen Weichart, Balzers (LI)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 16/309,552

(22) PCT Filed: Apr. 6, 2017

(86) PCT No.: PCT/EP2017/058198
§ 371 (c)(1),
(2) Date: Dec. 13, 2018

(87) PCT Pub. No.: WO2017/215806
PCT Pub. Date: Dec. 21, 2017

(65) Prior Publication Data
US 2019/0252160 A1   Aug. 15, 2019

(30) Foreign Application Priority Data

Jun. 15, 2016  (CH) .................................. 00767/16

(51) Int. Cl.
*H01J 37/32*  (2006.01)
(52) U.S. Cl.
CPC ...... *H01J 37/32651* (2013.01); *H01J 37/321* (2013.01); *H01J 37/3244* (2013.01);
(Continued)

(58) Field of Classification Search
None
See application file for complete search history.

(56) References Cited

U.S. PATENT DOCUMENTS

| | | | | |
|---|---|---|---|---|
| 6,096,160 A | * | 8/2000 | Kadomura | ................ C23F 4/00 |
| | | | | 156/345.49 |
| 2001/0035132 A1 | * | 11/2001 | Kent | ..................... C23C 16/509 |
| | | | | 118/733 |

(Continued)

FOREIGN PATENT DOCUMENTS

| | | |
|---|---|---|
| EP | 1 118 095 B1 | 7/2001 |
| JP | 2002-025983 A | 1/2002 |

(Continued)

OTHER PUBLICATIONS

International Search Report for PCT/EP2017/058198 dated May 30, 2017.
Written Opinion for PCT/EP2017/058198 dated May 30, 2017.

*Primary Examiner* — Karla A Moore
(74) *Attorney, Agent, or Firm* — Pearne & Gordon LLP (57) ABSTRACT

A vacuum treatment chamber includes a vacuum recipient and therein a screen. Within the screen there is provided a stationary substrate support. Within the side wall of the vacuum recipient, there is provided a substrate handling opening and in the screen, a substrate handling cut-out. A drivingly, moveable screen-shutter frees or covers the substrate handling cut-out in the screen. Thereby, horizontal loading and un-loading (L/UL) of a substrate to the stationary substrate support is possible, although establishing an overall closed screen, once a substrate is treated in the vacuum treatment chamber.

20 Claims, 6 Drawing Sheets

(52) U.S. Cl.
CPC .. *H01J 37/32477* (2013.01); *H01J 37/32715* (2013.01); *H01J 37/32743* (2013.01); *H01J 2237/334* (2013.01)

(56) References Cited

U.S. PATENT DOCUMENTS

| | | |
|---|---|---|
| 2002/0000368 A1 | 1/2002 | Weichart |
| 2003/0037880 A1* | 2/2003 | Carducci ............ H01L 21/76897 156/345.43 |
| 2004/0040664 A1* | 3/2004 | Yang ................. H01L 21/68785 156/345.51 |
| 2007/0131167 A1 | 6/2007 | Kodashima |
| 2009/0028761 A1 | 1/2009 | Devine |
| 2009/0176355 A1 | 7/2009 | Okumura |
| 2012/0018402 A1 | 1/2012 | Carducci |
| 2013/0068391 A1* | 3/2013 | Mazzocco ............. F16K 3/0218 156/345.33 |
| 2013/0087286 A1 | 4/2013 | Carducci |
| 2015/0129129 A1 | 5/2015 | Shimizu |
| 2015/0187542 A1 | 7/2015 | Ishida |

FOREIGN PATENT DOCUMENTS

| | | |
|---|---|---|
| WO | 00/02228 A1 | 1/2000 |
| WO | 02/0181771 A2 | 10/2002 |

\* cited by examiner

VACUUM TREATMENT CHAMBER AND METHOD OF MANUFACTURING A VACUUM TREATED PLATE-SHAPED SUBSTRATE

Frequently, vacuum treatment processes result in a material contamination of the inner surface of the wall of the vacuum recipient wherein treating is performed. In the case of etching, etched-off material may deposit on the addressed walls. Also in vacuum process layer deposition material may deposit on the inner surface of the wall of the vacuum recipient. Thus, contamination of the walls of the vacuum recipient may occur in CVD, PECVD, PVD treatment processes. In such cases it is known to provide a screen which, on one hand, often surrounds the substrate being treated and, on the other hand, protects at least major parts of the inner surface of the wall of the vacuum recipient from being contaminated by the vacuum treatment process. As such screens customarily loops around a central axis of the vacuum recipient with respect to which also the substrate holder is centralized, loading and unloading of the plate-shaped substrates is performed on and from a substrate support outside the screen. The substrate support is moved up and down in direction of the central axis towards and from the screen. Thereby the intrinsically provided bottom opening of the screen is exploited as substrate in-feed and substrate removal port.

On the other hand substrate handling to and from further treatment stations is often performed in a direction parallel to the two-dimensionally extended surfaces of the plate-shaped substrates. Thus in fact, the overall transport is then performed along three cartesian coordinate axes as of XYZ.

It is an object of the present invention to provide an improved vacuum treatment chamber.

When we speak throughout the present description and claim of a "plate-shaped substrate" we understand a substrate with two two-dimensionally extended surfaces and with a thickness extent which is significantly smaller than the extent in the addressed two dimensions. Thereby such plate-shaped substrate may be plane or bent.

Further we understand under the "plate-shaped substrate" also a batch of plate-shaped substrates which batch as well is two-dimensionally extended and comprises two or more substrates which are to be simultaneously treated in the vacuum treatment chamber as will be addresses and according to the present invention.

The vacuum treatment chamber according to the present invention which is especially a vacuum plasma treatment chamber for a plate-shaped substrate comprises:

A vacuum recipient with a side wall looping around a central axis. The vacuum recipient comprises a pumping port.

A screen within the vacuum recipient which loops around the central axis and extends along at least a part of the side-wall.

A stationary substrate support which is exposed to the inside of the screen. The stationary support is adapted to support a plate-shaped substrate at one of its two-dimensionally extended surfaces along a support plane which extends perpendicularly to the central axis.

At least one substrate handling opening in the side wall of the vacuum recipient, which opening has an opening central axis which is perpendicular to and which intersect the central axis, is thus oriented radially with respect to the center axis.

At least one substrate handling cut-out in the screen.

When we speak of "at least one" substrate handling opening in the side wall and of "at least" one substrate handling cut-out in the screen, we address the fact that the vacuum treatment chamber according to the invention may have, as will be more explicitly addressed later, one single access for loading and for unloading the substrate, but might also be provided with at least two openings in the sidewall and at least two substrate handling cut-outs, e.g. if loading a substrate into the treatment chamber and unloading such substrate from the treatment chamber is performed through respectively different openings and cut-outs.

When we speak of a "cut-out" this term includes an opening which is all side bordered by the member wherein it is provided as well as an open space which is one side open, as e.g. a U-shaped open space.

The substrate handling opening in the side wall and the substrate handling cut-out in the screen are mutually aligned and both are tailored to allow handling of a plate-shaped substrate towards and from the substrate support there through. Handling of the substrate is performed with its two-dimensionally extended plate surfaces perpendicularly to the central axis of the vacuum recipient, and thus parallel to the addressed support plane.

A drivingly movable screen-shutter i.e. a screen shutter which is movable by means of a drive and which drivingly frees or covers the substrate handling cut-out, in a controlled manner.

Thus, by the vacuum treatment chamber according to the invention, it becomes possible to load and unload plate-shaped substrates into the screen, i.e. in fact into the reaction space, parallel to the extended surfaces of the plate-shaped substrate and perpendicularly to the central axis of the recipient.

In one embodiment of the vacuum treatment chamber according to the invention the screen is made of metal.

Customary and as addressed, the screen is in fact made of metal on one hand, because it is e.g. a part to be exchanged during maintenance of the vacuum treatment chamber, e.g. for cleaning purposes and should be of relatively low price. Nevertheless, some vacuum treatments may require at least a predominant part of a processing space to be surrounded by a material which is adapted to a material e.g. which is to be deposited on the plate-shaped substrate by a layer deposition process. If, in such case, the material to be deposited, e.g. by a reactive plasma process on the plate-shaped substrate, is a dielectric material, then it might be advantageous to provide the screen of a dielectric material as well.

As already address, in one embodiment of the vacuum treatment chamber according to the invention, the screen is a maintenance-exchange part, which means, the screen may easily be removed and replaced without further major disassembling of the vacuum treatment chamber.

In a further embodiment of the vacuum treatment chamber according to the invention the screen has at least an electro-conductive surface, is preferably of metal, and the screen-shutter has as well has an electrically conductive surface, is preferably of metal as well. The screen-shutter is in electric contact with the screen at least in that position in which the cut-out is covered by the screen-shutter.

Whereas the screen-shutter may be moveable with respect to the cut-out in any desired direction so as to respectively open and close the addressed cut-out, in one embodiment of the vacuum treatment chamber according to the invention, the screen-shutter is drivingly moveable in a direction parallel to the central axis. As customary the central axis is oriented vertically, this means that the screen-shutter is normally drivingly movable up and down.

In one embodiment of the vacuum treatment chamber, the stationary substrate support, often called pedestal, comprises an electrically conductive support surface for the plate-shaped substrate which surface is electrically connected to a RF biasing source connector of the vacuum treatment chamber. Thus, in operation, the substrate holder and therewith the plate-shaped substrate residing thereon are RF biased.

In one embodiment of the vacuum treatment chamber according to the invention the substrate support as just addressed comprises at least three pins which project above the support plane and which are drivingly, i.e. by means of respective drives, retractable and ascendable along their axes and with respect to the support plane.

The pins define in their projecting position, a further support plane, parallel to said one support plane, which further support plane intersects said central axis inside screen.

Thus loading and unloading the plate-shaped substrate occurs not necessarily along the same plane, along which the plate shaped substrate resides during the treatment. In the embodiment just addressed loading and unloading the plate shaped substrate is performed with respect to the addressed further support plane, whereas substrate treatment is performed with the substrate positioned along the one support plane, as the pins are retracted. The screen cut-out and the opening in the side wall are aligned with such further plane to allow loading and unloading the plate shaped substrate, irrespective of the fact in which position or support plane they are deposited during treatment.

In one embodiment of the vacuum treatment chamber according to the invention, the one support plane intersects the central axis inside the screen, thus the substrate resides within the screen during the treatment.

The pins may be operated on a pre-determined electric potential and, in this case, they are of metal. Alternatively the pins may be operated on floating electric potential and may then be either of metal or of an electrically non-conductive material as e.g. of a dielectric material. Once a plate-shaped substrate is deposited on the ascended pins, the pins are retracted and the substrate is deposited for the treatment on the electrically conductive support and along the one support plane, where the plate-shaped substrate, in operation, become RF-biased.

Predominantly dependent upon the plate-shape of the substrate, the cross-sectional shape of the screen, considered in the direction of the central axis, is circular or polygonal, thereby especially circular, rectangular or square.

With an eye on substrates to be treated of circular shape it becomes apparent that the substrate handling opening as well as the cut-out in the screen will have to be dimensioned, perpendicularly to the loading/unloading direction, and parallel to the one or further support plane, with an extent slightly larger than the substrate diameter. Depending upon the orientation of a rectangular or square shaped substrate, the addressed substrate handling opening in the side wall and the cut-out in the screen are to be adapted to the respective dimension and handling orientation of the substrate for loading/unloading.

In a further embodiment of the vacuum treatment chamber according to the invention the screen has an electro-conductive surfaces, is thereby e.g. of metal and this surface is electrically connected to a system ground connector of the chamber via the metal side wall of the vacuum recipient.

Especially if in operation the substrate being treated is electrical biased by a biasing source, especially RF biased by an RF biasing source, and the treatment is performed with the help of a plasma within the screen, there is thereby established a RF current return path from the screen via the side wall, which is of metal, to the system ground connector to which a firm system ground potential is applied.

In one embodiment of the just addressed embodiment of the treatment chamber according to the invention, the screen is maintenance-exchangeable part which means that it may easily be replaced, e.g. for cleaning purposes, and the screen electrically contacts the addressed side wall, directly or indirectly, via resilient contact elements which are distributed all along the periphery of the screen, such periphery being considered seen in direction of the central axis. Each of the resilient contact elements is mechanically mounted either to the screen or to a metal part in electric contact with the side wall or to the side wall directly.

The resilient contact elements are thereby tailored to establish a firm low resistance current path from the screen to the metal side wall of the recipient and thereby to the system ground connector. Nevertheless, they thermally decouple the screen from the metal side wall of the vacuum recipient. This may be advisable if the screen is operated, during substrate treatment, at temperatures which are largely different from the temperature of the metal side wall.

In one embodiment of the vacuum treatment chamber according to the invention the vacuum recipient comprises a cover plate opposite the substrate support. The cover plate comprises at least one gas feedthrough line discharging into the inside space of the screen. If treating of the substrate makes use of a gas in the reaction space within the screen, as e.g. of a working gas for plasma generation and/or of a reactive gas for a reactive plasma or thermal treatment, there is provided through the addressed plate one or more than one gas feedthroughs for the respective gas or gases.

In one embodiment of the vacuum treatment chamber according to the invention it further comprises a bottom shield which loops around the central axes and which complements the screen with respect to side-wall protection. The bottom shield is of metal and the screen has an electro-conductive surface, is thereby preferably of metal as well. At, especially along the bottom rim of the screen, i.e. that rim closer to the substrate support, the screen, its electric conductive surface is -directly or indirectly—in electric contact with the bottom shield on one hand and, as well, with the metal side wall. Otherwise the bottom shield is electrically isolated from the other parts of the treatment chamber with a further exception, i.e. it is electrically firmly connected to the system ground connector.

In one embodiment a bottom shield looping around the central axis and complementing the screen with respect to said side-wall protection, overlaps the screen in direction of the central axis and externally of the screen. In one embodiment the bottom shield overlaps the screen along an area around the central axis which includes at least a part of the cut-out in the screen. In this case the bottom shield comprises a substrate handling cut-out as well aligned with the cut-out in the screen and with the substrate handling opening in said side-wall.

Especially if the treatment is performed by using a plasma and the substrate support is biased during operation with RF, this embodiment provides for two parallel RF return paths to the system ground connector, namely via plasma, the screen with electro-conductive surface, and, on one hand, the bottom shield, and, on the other hand, the metal side wall, down to the system ground connector. Thereby, the RF current return path impedance is significantly lowered.

In a further embodiment of the vacuum treatment chamber according to the invention the screen is of metal and is terminally decoupled from the side wall and/or from the bottom shield—if such shield is provided—in that the screen is suspended within the recipient and contacts the side wall and/or the bottom shield—if such is provided—only via resilient, distinct electric contact elements which are distributed along the periphery of the bottom rim of the screen.

Suspending the screen within the recipient at its top area, allows to avoid screen support along its bottom part. There it is only the addressed distinct electric contact elements which provide for electric contact thereby establishing negligible thermal coupling between the screen and the side wall of the recipient and, if provided, to the bottom shield as was addressed above.

In one embodiment of the vacuum treatment chamber according to the invention the screen is top-mounted—in one embodiment suspended—to a cooling or heating plate which comprises a channel arrangement for a cooling or heating medium. It is such a plate which in one embodiment is used to suspend the screen as was just addressed in context with thermal decoupling and gas feedlines to the inside of the screen are led through such cooling or heating plate.

With an eye back on the resilient contact elements, it may be seen that especially in the just addressed case of cooling down the screen, avoiding heat conduction from the screen to the side wall and/or to the bottom shield may be advantageous so as to avoid condensation along the inner surfaces of the vacuum recipient.

In one embodiment of the vacuum treatment chamber according to the invention the vacuum treatment chamber is an etching chamber and comprises an induction coil which loops around the central axes so as to generate an inductively coupled plasma within the vacuum recipient. The induction coil is located radially, with respect to the central axis, outside the screen, which is of metal. Thereby the side wall of the vacuum recipient comprises a part of dielectric material which as well loops around the central axes and is radially located between the screen and the coil. This part of the dielectric material substantially extends along the axial extend of the induction coil and may form the ambient atmosphere to vacuum separation. The metal screen thereby comprises a pattern of through slits, which are distributed along the metal screen. Such through-slits have a predominant component of direction of extent, which is parallel to the central axes. Such pattern of through-slits in the metal screen is provided to avoid excessive eddy current losses in the metal screen due to induction by the induction coil.

Any number of embodiments of the vacuum treatment chamber according to the invention as addressed may be combined if they are not mutually in contradiction.

The present invention is further directed on a method of manufacturing a vacuum treated plate-shaped substrate. The method comprises providing a screen separate from and along a part of the inner surface of a vacuum treatment chamber. Further the method comprises providing a stationary substrate holder which is adapted to support a plate shaped substrate as was addressed above along a plane and exposed to the inner space of the screen. A substrate in-feed cut-out in the screen is opened and a plate-shaped substrate is introduced through the opened substrate in-feed cut-out into the screen. The plate-shaped substrate is deposited on the substrate support and the substrate in-feed cut-out in the screen is closed, as well as a substrate removal cut out in the screen, if still open. Thereafter the substrate on the substrate support is vacuum treated. Subsequently the substrate removal cut-out in the screen is opened and the treated plate-shaped substrate is removed from the substrate support and from the screen and also from the vacuum treatment chamber through the substrate removal cut-out.

In one variant of the method according to the invention the substrate in-feed cut-out is the substrate removal cut-out. Thus one cut-out in the screen is exploited as in-feed and as removal cut-out.

In further variants of the method according to the invention it is performed by means of a vacuum treatment chamber according to the invention or according one or more than one of its embodiments.

The invention shall now be further explained by means of examples and with the help of figures.

Figure 1:
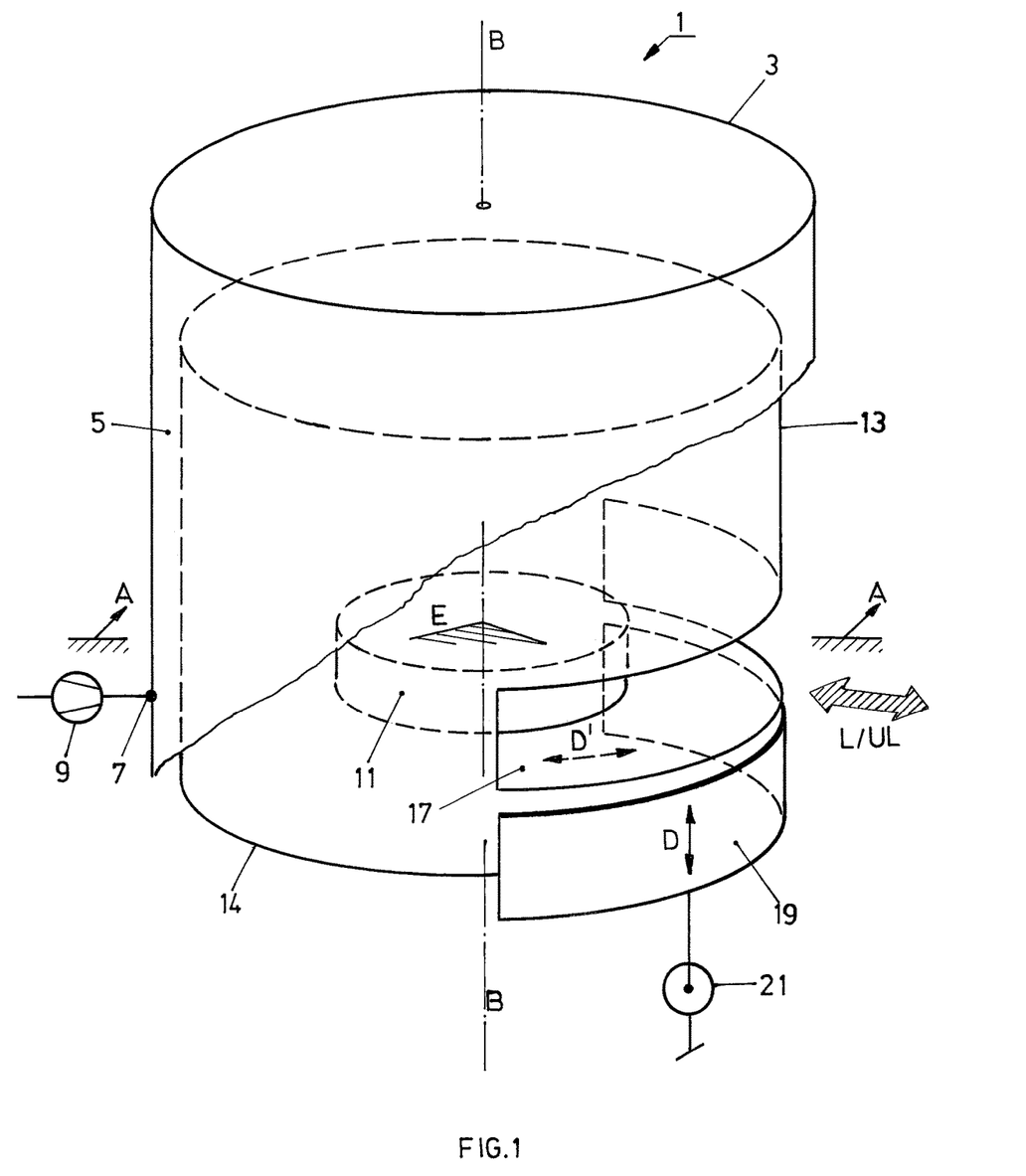
FIG. 1: In a perspective view, most schematically and simplified a part of one embodiment of a vacuum treatment chamber according to the invention.
Figure 2:
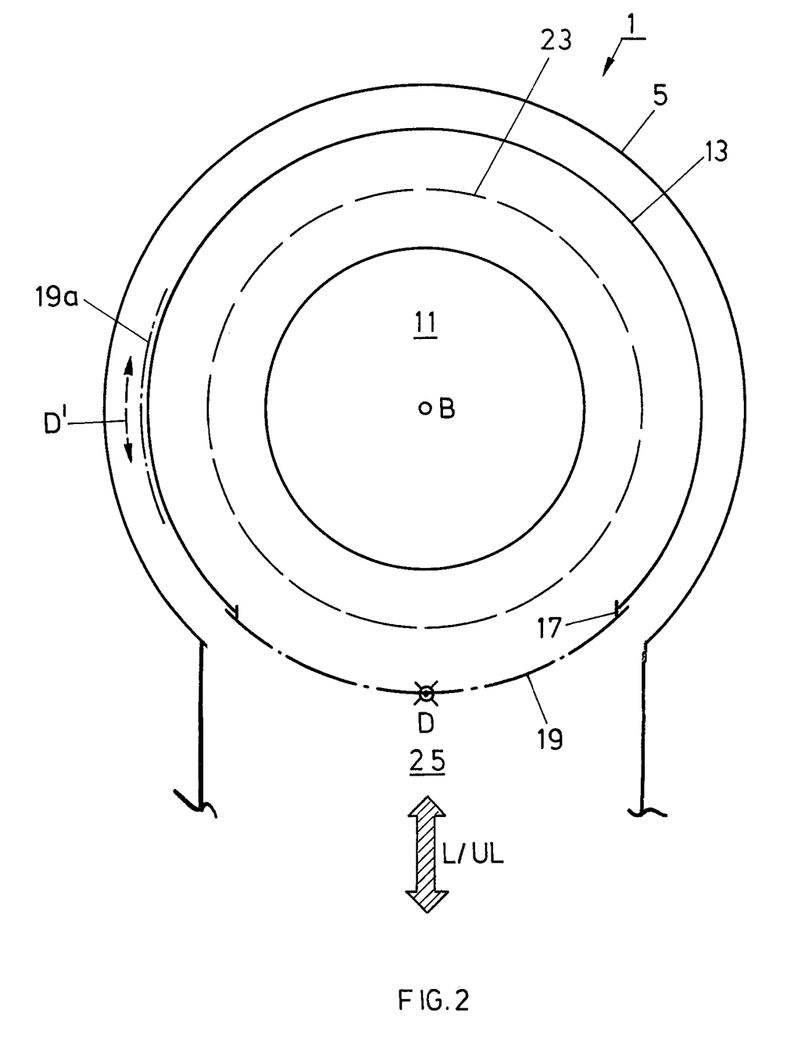
FIG. 2: Still schematically and simplified a cross-sectional view through the vacuum treatment chamber of the embodiment of FIG. 1.

The FIGS. 1 and 2 show most schematically and simplified a part of an embodiment of a vacuum treatment chamber according to the present invention.

FIG. 1 shows the address chamber 1 in perspective view, partly broken up, whereas FIG. 2 shows a cross section through the vacuum treatment chamber 1 of FIG. 1 along a plane as shown in FIG. 1 by A/A.

The vacuum treatment chamber 1 comprises a vacuum recipient 3 with a sidewall 5 looping around a central axis B. The sidewall 5 with respective covering and bottom (not shown in FIG. 1) separate ambient atmosphere from vacuum atmosphere. Vacuum atmosphere is established in the vacuum recipient 3 at a pumping port 7 to which a vacuum pump arrangement 9 may be mounted for operation.

Within the vacuum recipient 3, centralized about the central axis B, there is provided a stationary substrate support 11 which is adapted to support a number, equal or larger than one, of plate-shaped substrates positioned along or parallel to a plane E perpendicular to the central axis B. If we address a "plate-shaped substrate", this means a substrate which has a pair of two-dimensionally extended surfaces and having, in the third dimension, a thickness extent much smaller than the extent in both of the two addressed dimensions. Nevertheless, the plate-shaped substrate may be flat or bent.

If we address "a number equal or larger than one" this addresses a single plate-shaped substrate or a batch of more than one substrates, whereby the batch is two-dimensionally extended like a single plate-shaped substrate as addressed above. Thus, a "substrate" as addressed throughout the present description and claims addresses also such a batch of substrates.

There is further provided in the vacuum treatment chamber 1 a screen 13 which loops around the central axis B and which is radially distant from the central axis B thereby surrounding the substrate support 11. In a generic approach the screen 13 may be provided in touch with and along the inner surface of the sidewall 5 of the vacuum recipient 3 or distant therefrom, thus between the substrate support 11 and the inner surface of the sidewall 5. Further in a generic consideration the screen 13 may be of an electro-conductive or of an electro-nonconductive material.

Considered in the direction of the central axis B the substrate support 11 is positioned so that the at least one plate-shaped substrate is loaded to and unloaded from the support within the screen 13. Treatment of the plate shaped substrate is also be performed within the screen, but may also be performed outside the screen, considered in the direction of the central axis B, e. g. adjacent to the bottom rim of the screen 13.

Generically spoken loading and unloading the at least one plate-shaped substrate on and from the substrate support 11 is performed in a radial direction with respect to and perpendicular to the central axis B as schematically shown in FIG. 1 by the double-arrow L/UL. The loading/unloading trajectory path is thus parallel to the plane E and leads across the geometric body defined by the screen 13.

So as to perform this handling through the screen 13 there is provided in the screen 13 a substrate handling cut-out or opening 17. This substrate handling cut-out 17 has, considered parallel to plane E, a lateral extent which allows loading and unloading of a respectively extended plate-shaped substrate or of a respective batch with the two-dimensionally extended surfaces perpendicularly to central axis B.

The screen 13 covers and thus protects the predominant part of the inner surface of the side wall 5 from material influences resulting from the vacuum treatment inside the metal screen 13.

There is provided a screen-shutter 19 which is drivingly and controllably movable, as by a controlled drive unit 21, to cover or free the substrate handling cut-out 17 in the screen 13.

As is apparent from FIG. 1, a respective substrate handling opening (not shown in FIG. 1) is provided in the sidewall 5 of the vacuum recipient 3, which is aligned with the cut-out 17, to allow loading and unloading of the substrate or of a respective batch of substrates.

Whereas in the embodiment of FIG. 1 the screen-shutter 19 is drivingly moved—D—in a direction parallel to the central axis B, in another embodiment such a screen-shutter 19*a* (see FIG. 2) may be drivingly moveable as shown by the dash-dotted double-arrow D' in azimuthal direction with respect to the central axis B.

In the representation of FIG. 2 there is shown, additionally to the representation according to FIG. 1, and in dashed lines a plate-shaped substrate 23 and, in the sidewall 5 of vacuum recipient 3, the substrate handling opening 25.

Figure 3:
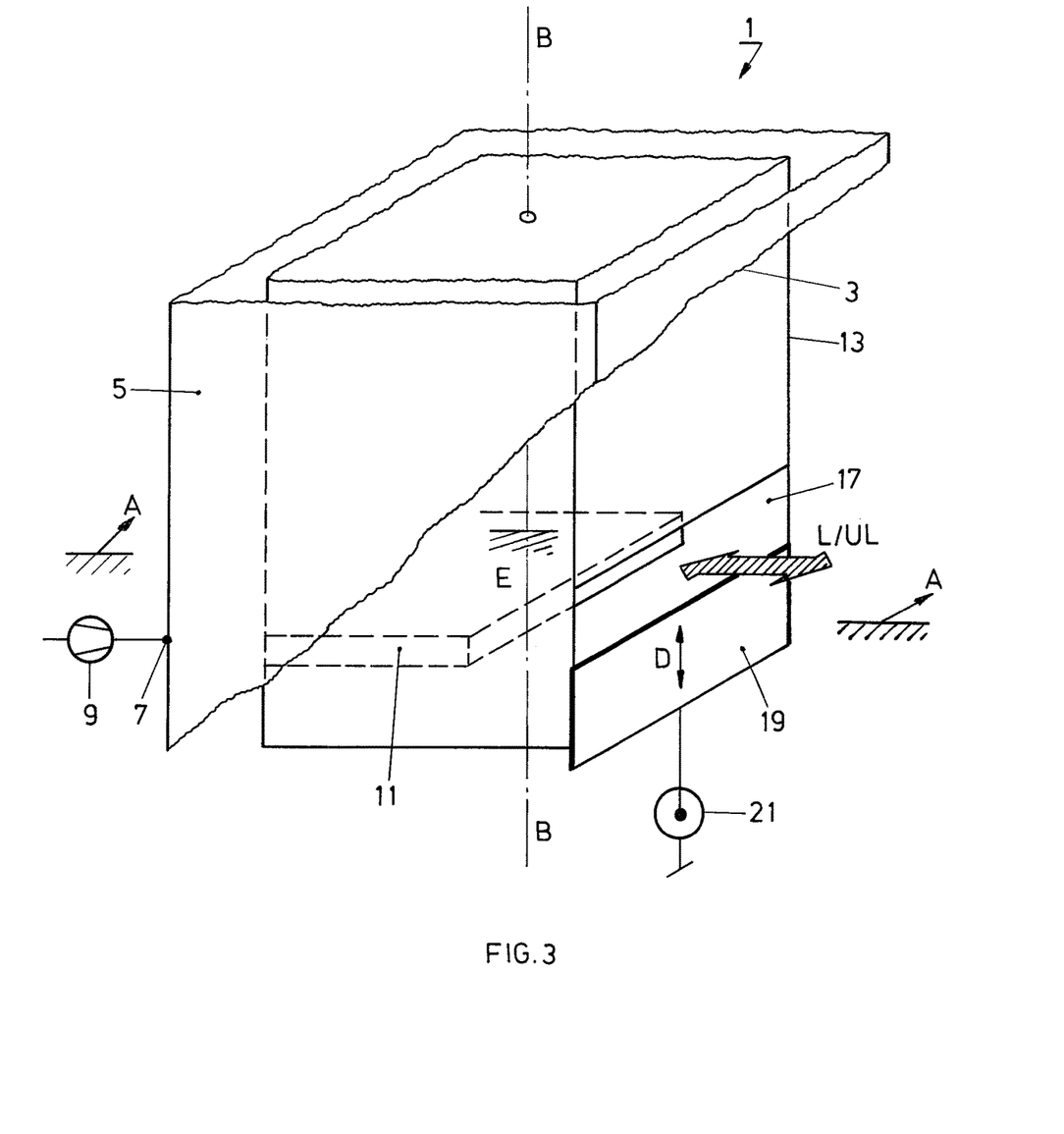
FIG. 3 in a representation in analogy to that of FIG. 1, a further embodiment of a vacuum treatment chamber according to the invention.
Figure 4:
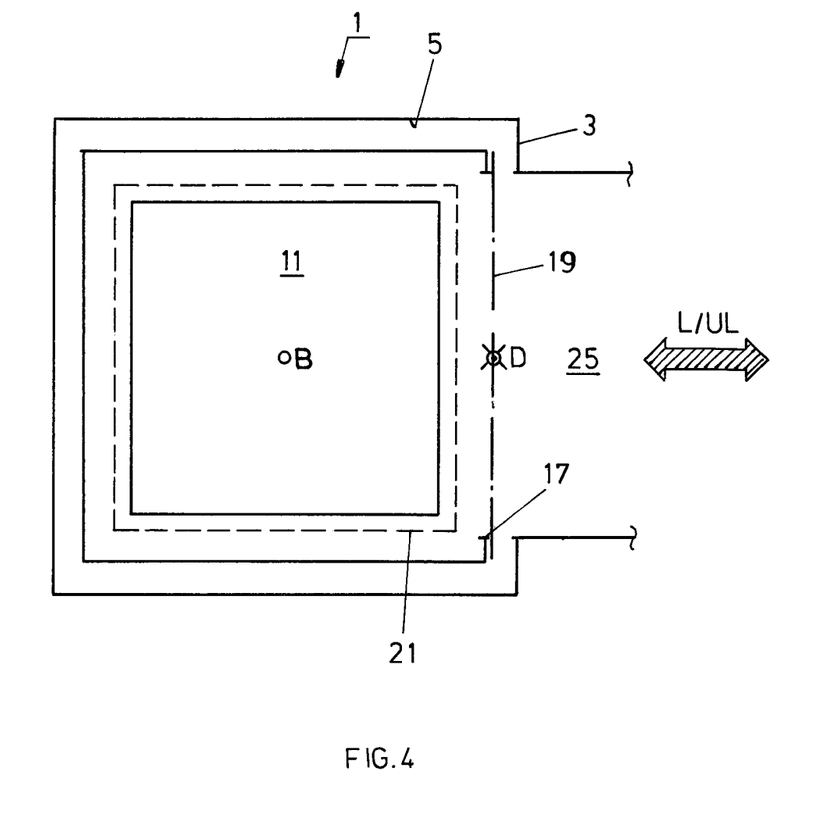
FIG. 4 in a representation in analogy to that of FIG. 2 a cross-sectional view of the embodiment according to FIG. 3.

Whereas FIGS. 1 and 2 show an embodiment of the vacuum treatment chamber 1 according to the invention for treating circular plate-shaped substrates or for treating a plate-shaped, circular batch of substrates, FIGS. 3 and 4 show an embodiment for vacuum treating polygonal, more specifically rectangular or square substrates or a respectively shaped batch of substrates.

In the drawings according to the FIGS. 3 and 4 the same reference numbers are used for the same parts as in the FIGS. 1 and 2 so that the skilled artisan needs no additional comments to these FIGS. 3 and 4.

The vacuum treatment chamber 1 is thereby especially a vacuum plasma treatment chamber, be it for PECVD- or PVD-layer deposition or -etching. The screen 13 is applied in all cases in which the inner surface of the vacuum recipient 3 and the equipment provided thereat is to be protected from material influences resulting from the treatment process.

Figure 5:
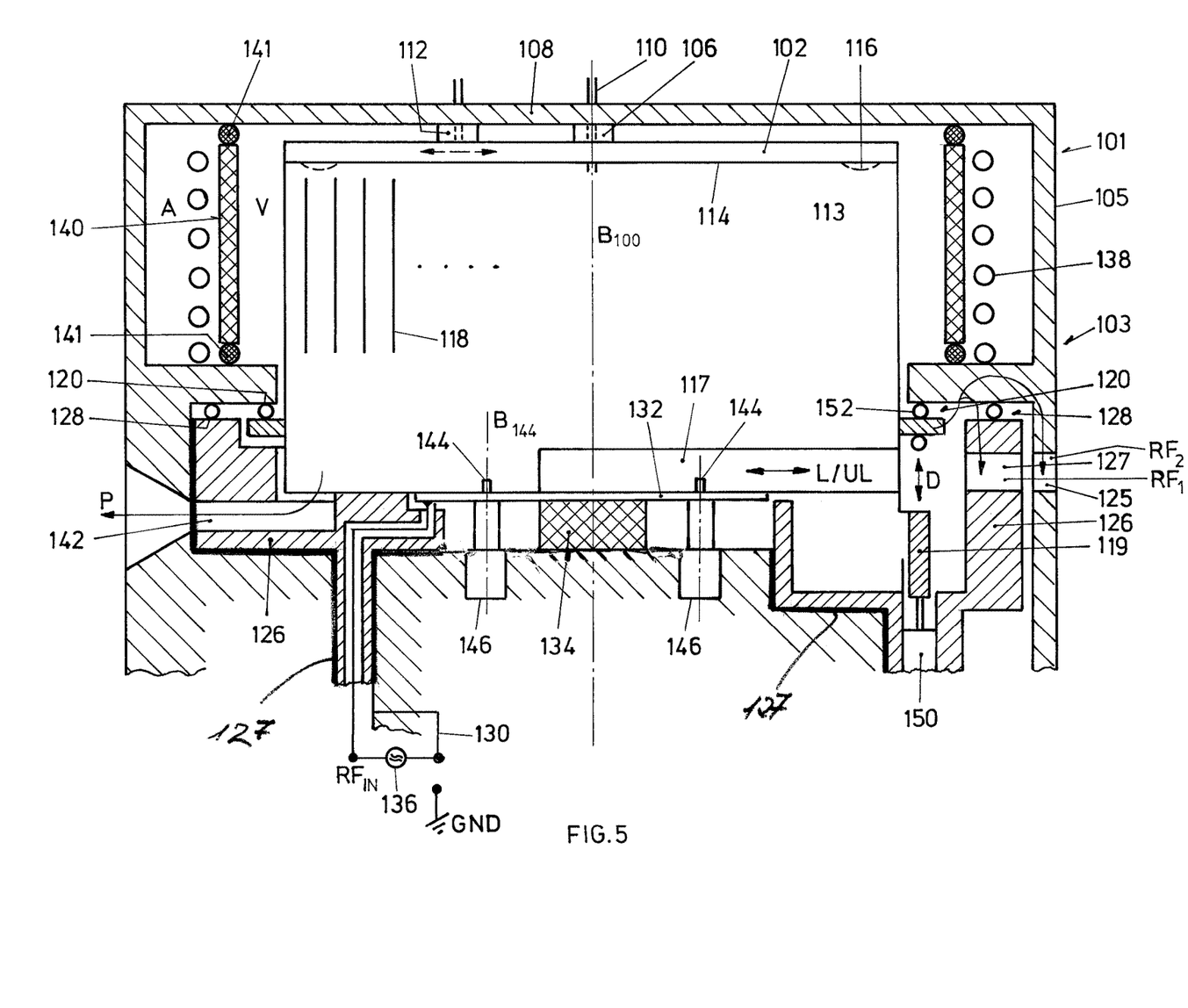
FIG. 5 still schematically and simplified, a specific embodiment of a vacuum treatment chamber according to the invention in cross-sectional representation, thereby showing features which may be applied also to other types of the vacuum treatment chamber of the invention than to that specifically shown in FIG. 5.

By means of FIG. 5 a specific embodiment of the vacuum treatment chamber 1 according to the invention shall be described with some characteristics which will subsequently be shortly addressed as applicable more generically to other types of the vacuum treatment chamber. FIG. 5 shows schematically and simplified a vacuum treatment chamber according to the present invention which is a plasma etching chamber making use of an inductively coupled plasma.

The vacuum etching chamber 101 comprises a vacuum recipient 103 with a sidewall 105 looping around the central axis $B_{100}$.

The screen 113 which is of metal and, in this embodiment, cylindrical, is suspended to a cooling plate 102 which is mounted by a gas-feedthrough 106 to the top cover plate 108 of the vacuum recipient 103. At least one gas feedline 110 for a working and/or reactive gas is fed through the gas feedthrough 106 to dispatch in the interior of the metal screen 113.

By means of a cooling medium feedthrough 112 and a channel arrangement, the cooling plate 102 is supplied with a cooling medium.

To establish a good thermal contact between the metal screen 113 and the cooling plate 102 the metal screen 113 is top-closed by a top cover 114. The metal screen 113 is tightly biased to the cooling plate 102 by means of screws 116.

The metal screen 113 comprises a pattern of through-slits 118 which have a predominant component of direction parallel to the central axis $B_{100}$.

Although the metal screen 113 being suspended to the cooling plate 102, it is biased via electrically conductive resilient elements 120 distributed all along the periphery of the metal screen 113 in an electrically conductive manner to a part of the sidewall 105 of the vacuum recipient 103.

Figure 6:
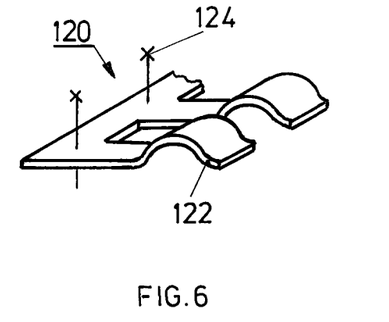
FIG. 6 simplified and in a perspective view resilient contact elements as may be applied to the embodiment of the vacuum treatment chamber according to FIG. 5 as well as, more generically, to other types of vacuum treatment chamber according to the invention.

As schematically shown in FIG. 6 the resilient elements 120 may, as an example, consist of comb-like groups of spring tongues 122 and mechanically mounted either to the metal screen 113 or to part of the sidewall 105 of the vacuum recipient 103 as indicated in FIG. 6 at reference number 124. The resilient elements 120 are distributed along the periphery of the metal screen 113, e.g. with constant spacing. These resilient elements 120 provide a good electric contact between the metal screen 113 and the sidewall 105 but only a small thermal conductance between the cooled metal screen 113 and the sidewall 105.

The electrically conducting resilient elements 120 may be realized by a large variety of different elements, so e.g. by tubular, hollow or full material resilient elements of circular, triangular, elliptic, polygonal cross-sectional shape. Importantly, these contact elements should provide for low electrical resistance and for low thermal conductance.

A bottom shield 126, coaxial to central axis $B_{100}$, complements the protecting action of screen 113. Close to the resilient elements 120, a further set of resilient elements 128, distributed all around the periphery of the metal screen 113, establishes electric contact between the side wall 105 and the bottom shield 126. The resilient elements 128 may, as an example, be realized similar to the elements 120, i.e. according to the example of FIG. 6 or the examples recited in context with the resilient elements 120. Thus, these resilient elements 128 as well may be realized by a wide variety of elements. In opposition to the resilient elements 120 the low thermal conductivity of the resilient elements 128 is less critical, as thermally in series with elements 120, in this embodiment.

Instead or additionally of the resilient elements 128 between the bottom shield 126 and the side wall 125 such resilient elements may be provided directly between the metal screen 113 and shield 126 and/or, in some cases—especially without RF bias of the substrate support—to the side wall 105 only.

The metal bottom shield 126 is a maintenance replacement part, similar to metal screen 113.

The bottom shield 126 as well as the side wall 105 of the vacuum recipient 103 may be firmly connected to system ground GND via a system ground connector 130.

The bottom shield 126 is electrically isolated from the metal sidewall 105 of the vacuum recipient 103, with the exception of the electrical connection to the system ground connector 130. This is schematically shown in FIG. 5 at 127 by thickened line.

The bottom shield 126 overlaps the bottom area of the screen 113 externally, to such an extent that a substrate handling cut out or opening 127 is also provided in the overlapping part of the bottom shield 126.

As most schematically shown, there is provided an RF feedline $RF_{IN}$ from an input tab to a metal substrate support 132 which is stationary mounted coaxially to the central axis $B_{100}$. As further schematically and simplifying shown by isolator 134 the metal substrate support or pedestal 132 is electrically isolated from any remaining part of the vacuum treatment chamber. An RF bias source 136 is applied, in operation, between the RF feedline $RF_{IN}$ and system ground connector 130. With respect to RF bias feed to the metal substrate support 132, the bottom shield 126 acts as the shield for a line $RF_{IN}$ as the core.

An RF current return path is established from the metal substrate support 132 via the plasma to the metal screen 113 and from there, on one hand, via resilient elements 120 and 128 to the bottom shield 126 and then to system ground, current path $RF_1$.

Parallel thereto there is on the other hand established a RF current return path $RF_2$ via resilient elements 120, sidewall 105 of the vacuum recipient 103 again to system ground GND. Establishing these two parallel RF return paths $RF_1$, $RF_2$ does significantly reduce the overall RF impedance for the addressed current to system ground, thereby improving efficiently and stability of the etching process. So as to generate the plasma inside of the metal screen 113, the etching reaction space, there is provided an induction coil 138 coaxially to the central axis $B_{100}$ and separated from the metal screen 113 by a dielectric wall 140 which, as schematically shown by vacuum seals 141 separates vacuum atmosphere V from ambient atmosphere A.

A pumping port 142 is to be connected to a vacuum pump so that a pumping gas flow P is established from the inside of the vacuum treatment chamber 1.

Laterally there is provided in the side wall 105 of the vacuum recipient 103 as well as in the bottom shield 126, a substrate handling opening 125 and cut-out 127 for instance according to the representation in FIG. 2. Radially aligned with the lateral substrate handling opening 125, there is provided, in the metal screen 113, a substrate handling cut-out 117 so that, as shown by the double-arrow L/UL, a plate-shaped substrate, orientated perpendicularly to the central axis $B_{100}$, may be loaded and unloaded through the substrate handling opening 125, through the cut outs 127 and 117 onto pins 144. The pins 144 are controllably movable along their axes $B_{144}$ and may thus be lowered to lower a substrate to be treated down on the metal plate substrate support 132 or to rise a treated substrate from the substrate support 132 in the position in which it may be seized by a (not shown) robot arm and removed from the metal screen 113 through the substrate handling opening 125 and the opened cut-out 117 and cut-out 127.

The pins 144 are up and down movable by means of controllable drive units 146.

Once the substrate handling opening 125 and the cut-out 127 and especially the substrate cut-out 117 in metal screen 113 is freed from a substrate being loaded or unloaded towards or from the metal substrate support 132, the cut-out 117 in the metal screen 113 may be closed by means of the screen-shutter 119 which is controllably drivingly movable by a drive unit 150, up and down. Closing the substrate cut-out 117 especially during etching operation, prevents contamination of the vacuum treatment chamber through the large cut-out 117 in the metal screen 113.

The metal movable screen-shutter 119 is operated on the same electric potential as the metal screen 113 especially in the operational, closed position. A good electric contact between the metal screen-shutter 119 and the metal screen 113 is established in the closed position of the metal screen-shutter 119 by means of electro-conductive resilient elements 152 which, as an example, may be tailored similarly to the resilient contact elements 120 and/or 128 and as shown, as an example, in FIG. 6. Also these resilient contact elements 152 are mounted in a distributed manner along the top rim of the screen-shutter 119 either on the screen 113 side or to the screen-shutter 119. As an example, the metal screen-shutter 119 is mounted to its drive 150 in an electrically isolated manner.

After having explained a specific embodiment of the vacuum treatment chamber 1 namely of such chamber being conceived as an etching chamber with inductively coupled plasma, some aspects of this chamber shall be addressed in a more generic view.

In context with the vacuum plasma etching chamber according to FIG. 5 we have addressed that the screen 113 is of metal. For other treatment applications, the treatment may be of dielectric material and so will be the screen-shutter according to 119 of FIG. 5. The screen 113 might be e.g. of a dielectric material if the substrate treatment performed therein is best operated if at least a major part of the surfaces surrounding the processing space is of the same material as the material which is to be deposited on the substrate by a respective plasma deposition treatment. Nevertheless, also in view that the screen 113 shall be a maintenance-replacement part and thus relatively low-cost, in most treatment applications, the screen 113 is made of metal.

If, as in the case of the embodiment according to FIG. 5, the substrate is operated during its treatment on an RF bias, the screen 113 of metal most significantly improves RF current return path.

In this context and in context with FIG. 5, we have addressed realization of parallel RF current return paths $RF_1$ and $RF_2$. This is realized primarily by establishing resilient electrical connectors between the metal screen as of 113 and the metal sidewall of the vacuum recipient and, parallel thereto, to a bottom shield and commonly down to a ground connector as of 130 of FIG. 5. This approach is especially to be applied whenever plasma treatment is performed and the substrate to be treated is operated on RF bias.

In this context the embodiment of FIG. 5 teaches that the metal screen-shutter 119 is operated in its closed position on the same electric potential as the metal screen 113. This is realized by the resilient, electrically conductive element 152 as the shutter 148 reaches closing positon. In another embodiment the metal screen-shutter 119 might be operated all the time on the electric potential of either the sidewall 105 of the vacuum recipient 103 or on the electric potential of the bottom shield 126, e.g. by sliding resilient contacts maintaining electrical contact to the metal screen-shutter 119 irrespective of its instantaneous position.

Further, plasma generation within the screen 113 may be realized in any known manner e.g. as a microwave plasma, as the plasma of an arc evaporation source, or of a sputtering source as of a magnetron source etc. It might even be advantageous to provide a screen 113 with a substrate handling cut-out 117 as was addressed in pure CVD treatment techniques without plasma generation.

By the addressed cut-out in the screen it becomes possible to perform handling of substrates to and from the treatment chamber in the same or at least in parallel planes as the substrates are handled outside the treatment chamber.

The screen shutter 119 is, as a maintenance exchange part similar to the screen 113, easily removable from its drive 150.

Summarizing aspects of the present invention:

A) A vacuum treatment chamber (1), especially a vacuum plasma treatment chamber for at least one plate shaped substrate, comprising:
- A vacuum recipient (3; 103) with a side wall (5; 105) looping around a central axis (B; $B_{100}$) and comprising a pumping port (7; 142);
- A screen (13; 113) within said vacuum recipient (3; 103) looping around said central axis (B; $B_{100}$) and along a part of said side wall (5; 105);
- A stationary substrate support (11; 132) exposed to the inside of said screen (13; 113) and adapted to support a plate shaped substrate at one of its two-dimensionally extended surfaces and along a support-plane (E) perpendicular to said central axis (B; B100) and
- At least one substrate-handling opening (25; 125) in said side wall (5; 105) with an opening central axis perpendicular to and intersecting said central axis (B, $B_{100}$);
- At least one substrate handling cut-out (17; 117) in said screen (13; 113),
- said substrate handling opening (25; 125) and said substrate handling cut-out (17; 117) being mutually aligned and tailored to allow handling of a plate shaped substrate towards and from said substrate support (11; 132) there through;
- A drivingly movable screen-shutter (19; 119) drivingly freeing and covering said substrate-handling cut-out (17; 117).

B) The vacuum treatment chamber preferably of aspect A wherein said screen is of metal.

C) The vacuum treatment chamber preferably of at least one of aspects A or B wherein said screen is a maintenance-exchange part.

D) The vacuum treatment chamber preferably of at least one of aspects A to C said screen has an electrically conductive surface, is preferably of metal, and said screen-shutter has an electrically conductive shutter-surface, is preferably of metal as well, and is in electric contact with said screen at least when said cut-out is covered by said screen-shutter.

E) The vacuum treatment chamber preferably of at least one of aspects A to D wherein said screen-shutter is drivingly movable in a direction parallel to said central axis.

F) The vacuum treatment chamber preferably of at least one of aspects A to E wherein said stationary substrate support comprises an electrically conductive support surface for the plate shaped substrate, electrically connected to an RF biasing source connector of said chamber.

G) The vacuum treatment chamber preferably of at least aspect F said substrate support comprising at least three pins projecting above said support plane and drivingly retractable and ascendible along their axes and with respect to said support plane.

H) The vacuum treatment chamber preferably of at least aspect G, wherein said pins in their projecting position, define a further support plane, parallel to said one support plane, which further support plane intersects said central axis inside screen.

I) The vacuum treatment chamber preferably of at least one of aspects A to H, wherein said support plane intersects said central axis inside said screen.

K) The vacuum treatment chamber preferably of at least one of aspects A to I wherein the cross sectional shape of said screen, considered in direction of said central axis, is one of circular and of polygonal, thereby especially circular, rectangular or of square.

L) The vacuum treatment chamber preferably of at least one of aspects A to K wherein said screen has an electroconductive surface, is preferably of metal, and is electrically connected to a system ground connector of said chamber, via said side-wall.

M) The vacuum treatment chamber preferably of at least aspect L wherein said screen is a maintenance-exchangeable part and electrically contacts directly or indirectly said side wall via resilient contact elements distributed along the periphery of the screen, each of said resilient contact elements being mechanically mounted either to the screen or to a metal part directly or indirectly in electric contact with said side wall.

N) The vacuum treatment chamber preferably of at least one of aspects A to M wherein said vacuum recipient comprises a cover plate opposite said substrate support, said cover plate comprising at least one gas feedthrough line discharging into the inside space of said screen.

O) The vacuum treatment chamber preferably of at least one of aspects A to N further comprising a bottom shield looping around said central axis and complementing said screen with respect to said side-wall, said bottom shield being of metal, said screen having an electro-conductive surface and being, at its bottom rim, in electric contact with said bottom shield as well as with said side wall, said bottom shield being otherwise electrically isolated from the other parts of said treatment chamber with the additional exception of being firmly electrically connected to said system ground connector.

P) The vacuum treatment chamber preferably of at least one of aspects A to O further comprising a bottom shield looping around said central axis and complementing said screen with respect to said side-wall, said bottom shield overlapping said screen in direction of said central axis and externally of said screen.

Q) The vacuum treatment chamber preferably of at least aspect P said bottom shield overlapping said screen along an area around said central axis which includes at least a part of said cut-out, said bottom shield comprising a substrate handling cut-out aligned with said cut-out in said screen and with said substrate handling opening in said side-wall.

R) The vacuum treatment chamber preferably of at least one of aspects A to Q wherein said screen is of metal and is thermally decoupled from said side wall and/or from the bottom shield, if provided, in that said screen is suspended in said recipient and contacts said side wall and/or said bottom shield, if provided, only via resilient, distinct electric contact elements distributed along the periphery of the bottom rim of said screen.

S) The vacuum treatment chamber preferably of at least one of aspects A to R, wherein said screen is top mounted to a cooling or heating plate comprising a channel arrangement for a cooling or heating medium.

T) The vacuum treatment chamber preferably of at least one of aspects A to S said vacuum treatment chamber being an etching chamber and comprising an induction coil looping around said central axis and outside said screen which is of metal, said side wall comprising a part of dielectric material looping around said central axis radially between said screen and said coil, said metal screen comprising a pattern of through-slits distributed along said metal screen and having a predominant component of direction of extent which is parallel to said central axis.

U) A method of manufacturing a vacuum treated plate shaped substrate comprising
  Providing a screen separate from and along a part of the inner surface of a vacuum treatment chamber;
  Providing a stationary substrate holder adapted to support a plate-shaped substrate along a plane and exposed to the inner space of said screen;
  Opening a substrate in-feed cut-out in said screen;
  Introducing a plate shaped substrate with one of its two dimensionally extended surfaces parallel to said plane through said opened substrate in-feed cut-out into said screen;
  Depositing said plate shaped substrate on said substrate support;
  Closing said substrate in-feed cut-out in said screen as well as a substrate removal cut-out in said screen if not already closed;
  Vacuum treating said substrate on said support and in said screen;
  Opening said substrate removal cut-out;
  Removing said treated plate shaped substrate from said support and from said screen and from said vacuum treatment chamber through said substrate removal cut-out.

V) The method of manufacturing a vacuum treated plate shaped substrate preferably according to at least aspect U comprising
  vacuum treating said substrate on said support and in said screen thereby Rf biasing said substrate.

W) The method of manufacturing a vacuum treated plate shaped substrate preferably according to at least one of aspects U or V said vacuum treating being etching, preferably exploiting an inductively coupled plasma.

X) The method of manufacturing a vacuum treated plate shaped substrate preferably according to at least one of aspects U or W further comprising establishing at least two distinct mutually parallel current paths, at least during said treating, a first current path from said screen via the wall of said vacuum treatment chamber to a system ground connector, the second current path from said screen via a shield in said vacuum treatment chamber to said system ground connector.

Y) The method preferably of at least one of aspects U to X, wherein said substrate in-feed cut-out is said substrate removal cut-out.

Z) The method preferably of at least one of aspects U to Y performed by means of a vacuum treatment chamber according to at least one of aspects A to T.

What is claimed is:
1. A vacuum treatment chamber for at least one plate-shaped substrate, comprising:
  a vacuum recipient with a side wall looping around a central axis and comprising a pumping port, said side wall having a bottom rim;
  a screen within said vacuum recipient looping around said central axis and along a part of said side wall, said screen having a bottom rim;
  a stationary substrate support exposed to the inside of said screen and adapted to support the plate-shaped substrate at one of its two-dimensionally extended surfaces and along a support-plane perpendicular to said central axis;
  at least one substrate handling opening in said side wall with an opening central axis perpendicular to and intersecting said central axis;
  at least one substrate handling cut-out in said screen;
  a drivingly movable screen-shutter drivingly freeing and covering said substrate handling cut-out;
  a bottom shield looping around said central axis and complementing said screen, said bottom shield being of metal, wherein:
said substrate handling opening and said substrate handling cut-out are mutually aligned and tailored to allow handling of the plate-shaped substrate towards and from said substrate support there through;
said screen has an electrically conductive surface;
said screen-shutter has an electrically conductive shutter-surface, which is in electric contact with said electrically conductive surface of said screen at least when said substrate handling cut-out is covered by said screen-shutter;
said stationary substrate support comprises an electrically conductive support surface for the plate-shaped substrate, electrically connected to an RF biasing source connector of said vacuum treatment chamber;
said screen remote from its bottom rim is electrically connected via said side wall to a system ground connector of said vacuum treatment chamber for establishing a first current path, wherein said screen at its bottom rim is also in electric contact with said side wall;
said bottom shield is mounted in an electrically isolated manner with the following exceptions:
  said bottom shield is firmly electrically connected to said system ground connector;
  said screen at its bottom rim is in electric contact with said bottom shield and is further electrically connected via said bottom shield to said system ground connector for establishing a second current path; and
  said side wall at its bottom rim is in electric contact with said bottom shield.

2. The vacuum treatment chamber of claim 1, wherein said screen is of metal.

3. The vacuum treatment chamber of claim 1, wherein said screen is a maintenance-exchange part.

4. The vacuum treatment chamber of claim 1, said screen-shutter is of metal.

5. The vacuum treatment chamber of claim 1, wherein said screen-shutter is drivingly movable in a direction parallel to said central axis.

6. The vacuum treatment chamber of claim 5, said substrate support comprising at least three pins projecting above said support plane and drivingly retractable and ascendible along their axes and with respect to said support plane.

7. The vacuum treatment chamber of claim 6, wherein said pins in their projecting position, define a further support plane, parallel to said support plane, which further support plane intersects said central axis inside said screen.

8. The vacuum treatment chamber of claim 1, wherein said support plane intersects said central axis inside said screen.

9. The vacuum treatment chamber of claim 1, wherein the cross sectional shape of said screen, considered in direction of said central axis, is one of circular or polygonal.

10. The vacuum treatment chamber of claim 1, wherein said screen is a maintenance-exchangeable part and electrically contacts directly or indirectly said side wall via resilient contact elements distributed along the periphery of the screen, each of said resilient contact elements being mechanically mounted either to the screen or to a metal part directly or indirectly in electric contact with said side wall.

11. The vacuum treatment chamber of claim 1, wherein said vacuum recipient comprises a cover plate opposite said substrate support, said cover plate comprising at least one gas feedthrough line discharging into the inside space of said screen.

12. The vacuum treatment chamber of claim 1, said bottom shield overlapping said screen in direction of said central axis and externally of said screen.

13. The vacuum treatment chamber of claim 1, said bottom shield overlapping said screen along an area around said central axis which includes at least a part of said substrate handling cut-out, said bottom shield comprising a substrate handling cut-out aligned with said substrate handling cut-out in said screen and with said substrate handling opening in said side-wall.

14. The vacuum treatment chamber of claim 1, wherein said screen is of metal and is thermally decoupled from said side wall and/or from said bottom shield, in that said screen is suspended in said vacuum recipient and contacts said side wall and/or said bottom shield, only via resilient, distinct electric contact elements distributed along the periphery of the bottom rim of said screen.

15. The vacuum treatment chamber of claim 1, wherein said screen is top mounted to a cooling or heating plate comprising a channel arrangement for a cooling or heating medium.

16. The vacuum treatment chamber of claim 1, said vacuum treatment chamber being an etching chamber and comprising an induction coil looping around said central axis and outside said screen which is of metal, said side wall comprising a part of dielectric material looping around said central axis radially between said screen and said coil, said metal screen comprising a pattern of through-slits distributed along said metal screen and having a predominant component of direction of extent which is parallel to said central axis.

17. A method of manufacturing a vacuum treated plate-shaped substrate performed by using the vacuum treatment chamber according to claim 1, the method comprising:
providing the screen separate from and along a part of an inner surface of said vacuum treatment chamber;
providing the stationary substrate support adapted to support the plate shaped substrate along a plane and exposed to an inner space of said screen;
opening said at least one substrate handling cut-out in said screen;
introducing the plate-shaped substrate with one of its two dimensionally extended surfaces parallel to said plane through said opened at least one substrate handling cut-out into said screen;
depositing said plate-shaped substrate on said substrate support;
closing said opened at least one substrate handling cut-out in said screen;
vacuum treating said plate-shaped substrate on said substrate support and in said screen thereby Rf biasing said plate-shaped substrate;
establishing at least the first and the second current paths at least during said vacuum, treating, said first and second current paths being distinct and mutually parallel current paths;
opening said at least one substrate handling cut-out;
removing said treated plate-shaped substrate from said substrate support and from said screen and from said vacuum treatment chamber through said at least one substrate handling cut-out.

18. The method of claim 17, said vacuum treating being etching, preferably exploiting an inductively coupled plasma.

19. The vacuum treatment chamber of claim 1, being a vacuum plasma treatment chamber.

20. A method of manufacturing a vacuum treated plate-shaped substrate performed by using the vacuum treatment chamber according to claim 1, the method comprising:
providing the screen separate from and along a part of an inner surface of said vacuum treatment chamber;
providing the stationary substrate support adapted to support the plate-shaped substrate along a plane and exposed to an inner space of said screen;
opening said at least one substrate handling cut-out in said screen;
introducing the plate-shaped substrate with one of its two dimensionally extended surfaces parallel to said plane through said opened at least one substrate handling cut-out into said screen;
depositing said plate-shaped substrate on said substrate support;
closing said opened at least one substrate handling cut-out in said screen;
vacuum treating said plate-shaped substrate on said substrate support and in said screen thereby Rf biasing said plate-shaped substrate;
establishing at least the first and the second current paths at least during said vacuum treating, said first and second current paths being distinct and mutually parallel current paths;
opening said at least one substrate handling cut-out;
removing said treated plate-shaped substrate from said substrate support and from said screen and from said vacuum treatment chamber through said opened at least one substrate handling cut-out.

* * * * *